US008320165B1

United States Patent
Garcia et al.

(10) Patent No.: US 8,320,165 B1
(45) Date of Patent: *Nov. 27, 2012

(54) SRAM STRAP ROW SUBSTRATE CONTACT

(75) Inventors: Robert R. Garcia, Rockwall, TX (US); Theodore W. Houston, Richardson, TX (US)

(73) Assignee: Texas Instrument Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 13/301,217

(22) Filed: Nov. 21, 2011

Related U.S. Application Data

(60) Provisional application No. 61/418,320, filed on Nov. 30, 2010.

(51) Int. Cl.
*G11C 11/00* (2006.01)
(52) U.S. Cl. .................. 365/154; 365/230.08; 438/223; 257/E21.63
(58) Field of Classification Search .................. 365/154, 365/230.08; 438/223; 257/E21.63
See application file for complete search history.

(56) References Cited

U.S. PATENT DOCUMENTS

| 6,285,088 B1* | 9/2001 | Madan ........................... 257/202 |
| 6,569,723 B2* | 5/2003 | Liaw ............................... 438/153 |
| 7,906,389 B2* | 3/2011 | Liaw ............................... 438/223 |

OTHER PUBLICATIONS

U.S. Appl. No. 13/301,132, filed Nov. 21, 2011, entitled "SRAM Strap Row Well Contact,".
U.S. Appl. No. 13/301,287, filed Nov. 21, 2011, entitled "SRAM Strap Row Double Well Contact,".

* cited by examiner

*Primary Examiner* — Connie Yoha
(74) *Attorney, Agent, or Firm* — Rose Alyssa Keagy; Wade J. Brady, III; Frederick J. Telecky, Jr.

(57) ABSTRACT

An integrated circuit containing an SRAM array having a strap row. The strap row has a substrate contact structure that includes a substrate contact plug and a tap layer.

11 Claims, 5 Drawing Sheets

SRAM STRAP ROW SUBSTRATE CONTACT

CROSS-REFERENCE TO RELATED APPLICATIONS

This application claims the benefit of priority under U.S.C. §119(e) of U.S. Provisional Application 61/418,320, entitled "SRAM Strap Row Substrate Contact"), filed Nov. 30, 2010, the entirety of which is incorporated herein by reference.

Furthermore, this application is related to:

Patent application Ser. No. 13/301,287 entitled "SRAM STRAP ROW DOUBLE WELL CONTACT," and Patent application Ser. No. 13/301,132 entitled "SRAM STRAP ROW SUBSTRATE CONTACT."

With their mention in this section, these patent applications are not admitted to be prior art with respect to the present invention; patent application Ser. No. 13/301,217

BACKGROUND OF THE INVENTION

This invention relates to the field of integrated circuits. More particularly, this invention relates to the strap row of static random access memories (SRAMs) in an integrated circuit.

DETAILED DESCRIPTION

Figure 1A:
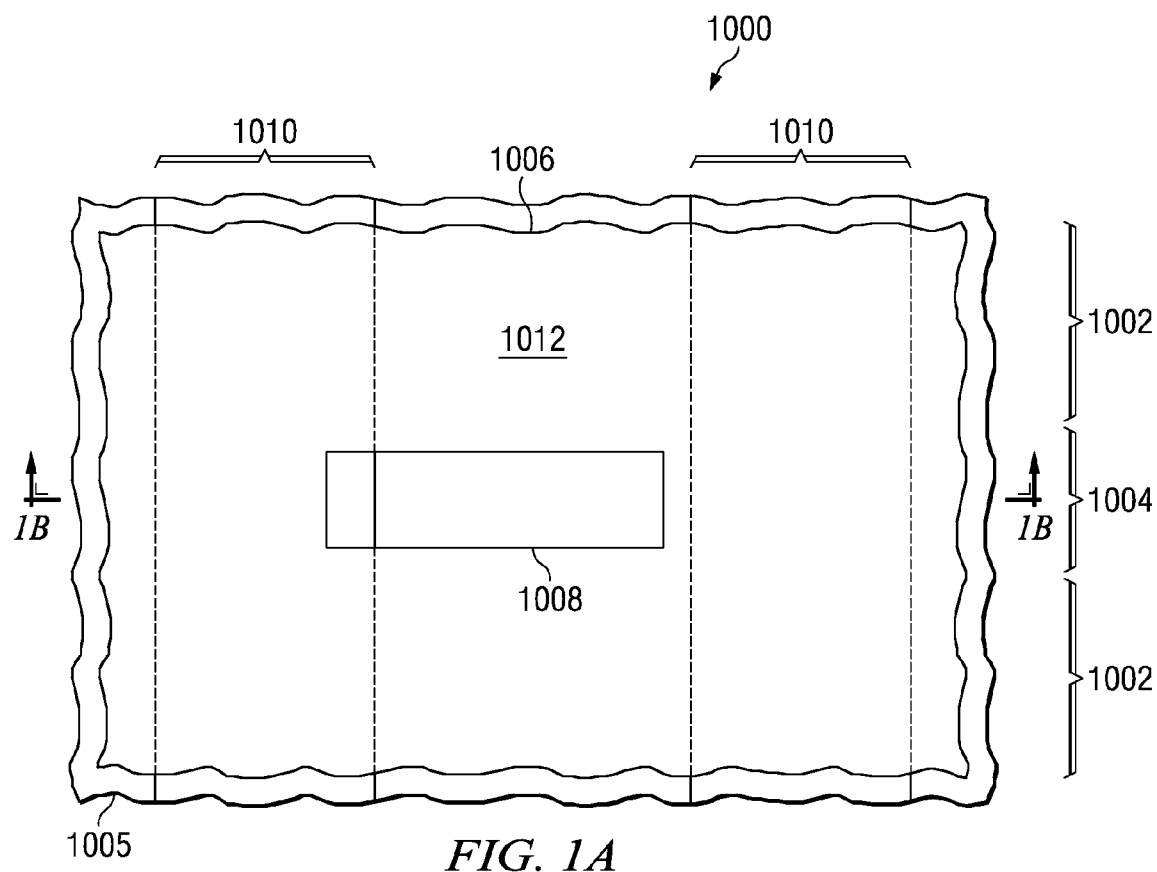
FIG. 1A through FIG. 1F are top views and cross sections of an integrated circuit containing an SRAM array with a strap row which includes a substrate contact structure.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

A static random access memory (SRAM) cell includes a first set of p-type semiconductor regions which contain n-channel metal oxide semiconductor (NMOS) transistors, and a second set of n-type semiconductor regions which contain p-channel metal oxide semiconductor (PMOS) transistors. In a commonly used configuration of an SRAM cell formed on a monolithic p-type substrate, the p-type regions are directly contacting the substrate so that the p-type regions are electrically connected to other p-type regions through the substrate. In this configuration, the p-type regions may be referred to as p-wells (or substrate regions) and the n-type regions may be referred to as n-wells. In an alternate configuration of an SRAM cell formed on a monolithic n-type substrate, in which the n-type regions are directly contacting the substrate, the n-type regions may be referred to as n-wells (or substrate regions) and the p-type regions may be referred to as p-wells.

In another configuration where an SRAM cell is formed on a monolithic p-type substrate, the p-type regions may be electrically isolated from the substrate by a deep n-well that is sometimes referred to as an isolation n-well. This isolation n-well may directly contact (thereby electrically connecting) the n-type regions. Alternatively, the SRAM may be formed on a monolithic n-type substrate where the n-type regions may be electrically isolated from the substrate by a deep p-well that is sometimes referred to as an isolation p-well. This isolation p-well may directly contact (thereby electrically connecting) the p-type regions. In a further configuration, an SRAM may be formed on a silicon-on-insulator (SOI) substrate. In each of these configurations, the p-type regions are called p-wells and the n-type regions are called n-wells.

For the purposes of this disclosure, active areas are understood to be areas of a semiconductor wafer that are located in openings of a field oxide layer. Active areas having a same conductivity type as the wells under the active areas are referred to as tap areas. Therefore, a tap layer may be created to form a contact to an underlying well; thereby electrically connecting a contact plug formed on the surface of the tap layer to a well that is located under the active area.

FIG. 1A through FIG. 1F are top views and cross sections of an integrated circuit containing an SRAM array having a strap row. The strap row includes a well contact structure that is formed according to an embodiment (and depicted in successive stages of fabrication). Referring to the top view of FIG. 1A, an integrated circuit 1000 contains a portion of an SRAM array that includes SRAM cell rows 1002 and a strap row 1004. Each SRAM cell row 1002 will typically contain a plurality of rows of SRAM cells. A layer of field oxide 1006 is formed at a top surface of a semiconductor substrate 1005. An opening in the layer of field oxide 1006 forms a substrate tap active area 1008 in the strap row 1004.

First polarity wells 1010 may be formed by ion implanting a well dopant species of a first polarity into the integrated circuit 1000. The first polarity wells 1010 alternate with second polarity wells 1012 in the SRAM cell row areas 1002 in this embodiment. The first polarity wells 1010 have an opposite conductivity type from the second polarity wells 1012. In one version of the instant embodiment, the integrated circuit 1000 may be formed on a monolithic p-type substrate that does not have an isolation well, the first polarity wells 1010 may be n-type, and the second polarity wells 1012 may be p-type. The second polarity wells may also contact the substrate 1005. In such a version, it will be recognized that an operation to provide doping to the second polarity wells 1012 (such as a well implant) may not be performed.

In another version, the integrated circuit 1000 may be formed on a monolithic n-type substrate without an isolation well, the first polarity wells 1010 may be p-type, and the second polarity wells 1012 may be n-type. The second polarity wells may also contact the substrate.

In a further version, an isolation well may be formed under the first polarity wells 1010 and the second polarity wells 1012. The term "substrate" will be used in describing the instant embodiment with the acknowledgment that in an embodiment formed on an SOI substrate, the term "substrate" would be understood to refer to the second polarity wells.

In the instant embodiment, both the first polarity wells 1010 and the second polarity wells 1012 extend contiguously across a strap row 1004 and into an adjacent SRAM cell row 1002. The substrate tap active area 1008 is located in the second polarity well 1012 and may optionally overlap one or both of the adjacent first polarity wells 1010. FIG. 1A through FIG. 1F depicts the substrate tap active area 1008 overlapping just one of the adjacent first polarity wells 1010.

Figure 1B:
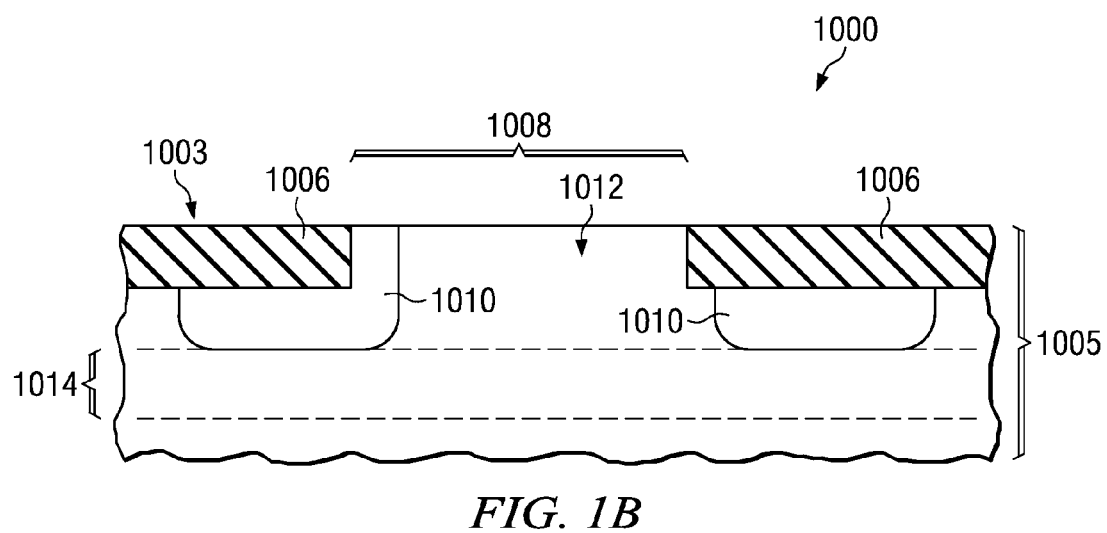

Referring to FIG. 1B (which is a cross section along the section line 1B-1B of FIG. 1A), the layer of field oxide 1006 is formed at a top surface 1003 of the substrate 1005. The portion of the substrate 1005 that underlies the first polarity wells 1010 and the second polarity well 1012 is referred to in this embodiment as a connecting layer 1014. The connecting layer 1014 has the same conductivity as the second polarity wells 1012. In a version of the instant embodiment in which the second polarity well 1012 has the same conductivity type as the substrate 1005, the connecting layer 1014 extends to the bottom surface of the substrate 1005. In another version of this embodiment in which an isolation well having the opposite conductivity type from the substrate is formed below the SRAM array, the connecting layer 1014 illustrated in FIG. 1B may be a portion of the isolation well that exists below both the first polarity wells 1010 and the second polarity well 1012. In yet another version of the instant embodiment that is formed on an SOI substrate, the connecting layer 1014 may not be present.

The layer of field oxide 1006 has a gap at the location of the substrate tap active area 1008. One or both of the adjacent first polarity wells 1010 may optionally extend into the location for the substrate tap active area 1008, as described supra in reference to FIG. 1A. In the instant embodiment, the bottom surface of the first polarity wells 1010 is below the bottom surface of the field oxide 1006. In addition, the second polarity well 1012 extends between adjacent first polarity wells 1010. Moreover, the connecting layer 1014 extends under the first polarity wells 1010 and the second polarity well 1012 to electrically connect adjacent second polarity wells 1012 (not shown).

Figure 1C:
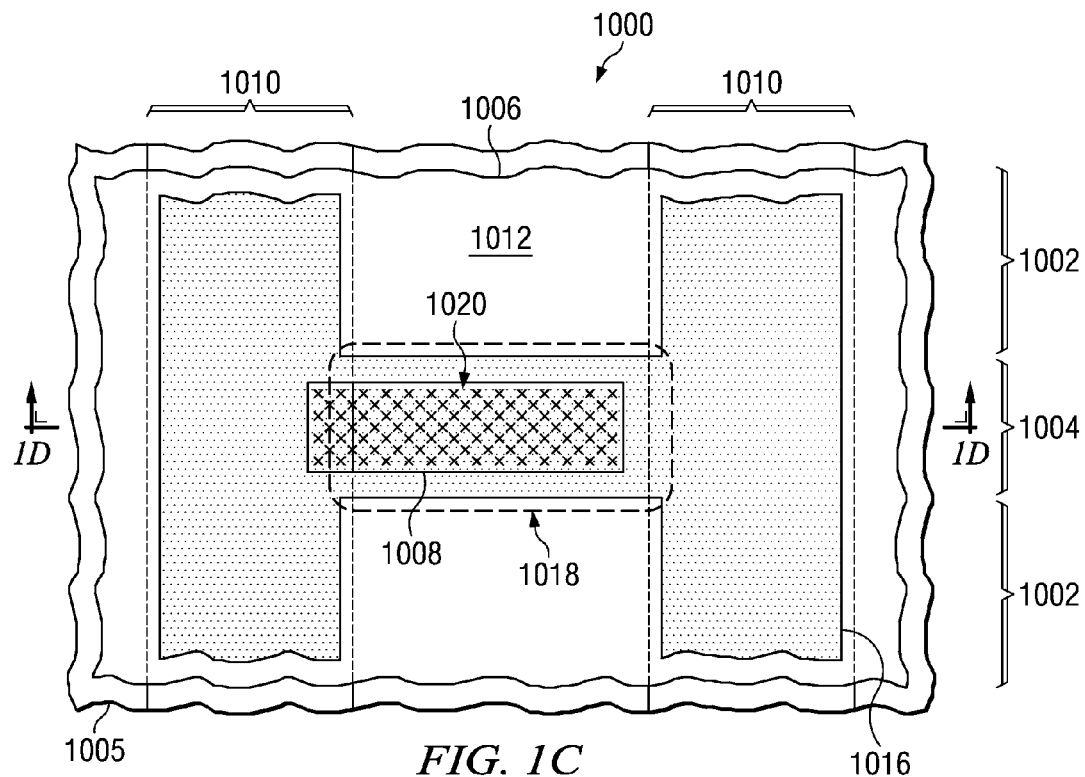

Referring to the top view of FIG. 1C, a patterned SRAM implant mask 1021 (not shown in FIG. 1C but shown in FIG. 1D) is formed on the top surface 1003 of the substrate 1005 to expose the top surface 1003 in a source/drain/tap area 1016. In the SRAM cell rows 1002, at least a portion of the SRAM source/drain/tap area 1016 is located in the first polarity wells 1010. The SRAM source/drain/tap area 1016 extends continuously in the first polarity well 1010 of a first SRAM cell row, to the adjacent strap row 1004, and then to the next SRAM cell row 1002. In addition, the SRAM source/drain/tap area 1016 includes a tap connecting region 1018 in the strap row 1004. The SRAM source/drain/tap area 1016 is depicted with a stipple pattern in FIG. 1C and FIG. 1E.

An ion implantation process may be used to implant dopants into the top surface 1003 at the location of the source/drain/tap area 1016. The implant dopants have the same conductivity type as the second polarity well 1012, thereby providing source and drain regions for the transistors in the first polarity wells 1010 of the SRAM cell rows 1002. The implant dopants also create a tap layer 1020 (depicted with a "x" pattern in FIGS. 1C-1F) in the substrate tap active area 1008 of the strap row 1004. Therefore, the tap layer 1020 provide an electrical connection to the second polarity well 1012 under the substrate tap active area 1008

Figure 1D:
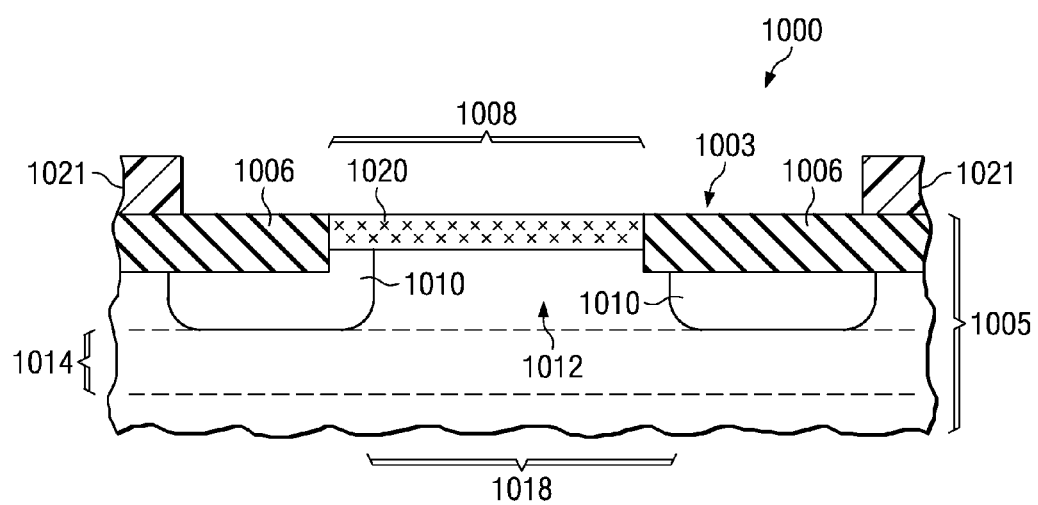

As shown in FIG. 1D (which is a cross section along the section line 1D-1D of FIG. 1C), the tap layer 1020 is formed at the existing top surface 1003 of the integrated circuit 1000 in the substrate tap active area 1008. In the instant embodiment, the tap layer 1020 does not extend below the layer of field oxide 1006. As noted supra, the tap layer 1020 in which the source/drain/tap area 1016 overlaps the second polarity well 1012 in the substrate tap active area 1008 of the strap row 1004 is depicted in FIGS. 1C-1F with an "x" fill pattern.

Figure 1E:
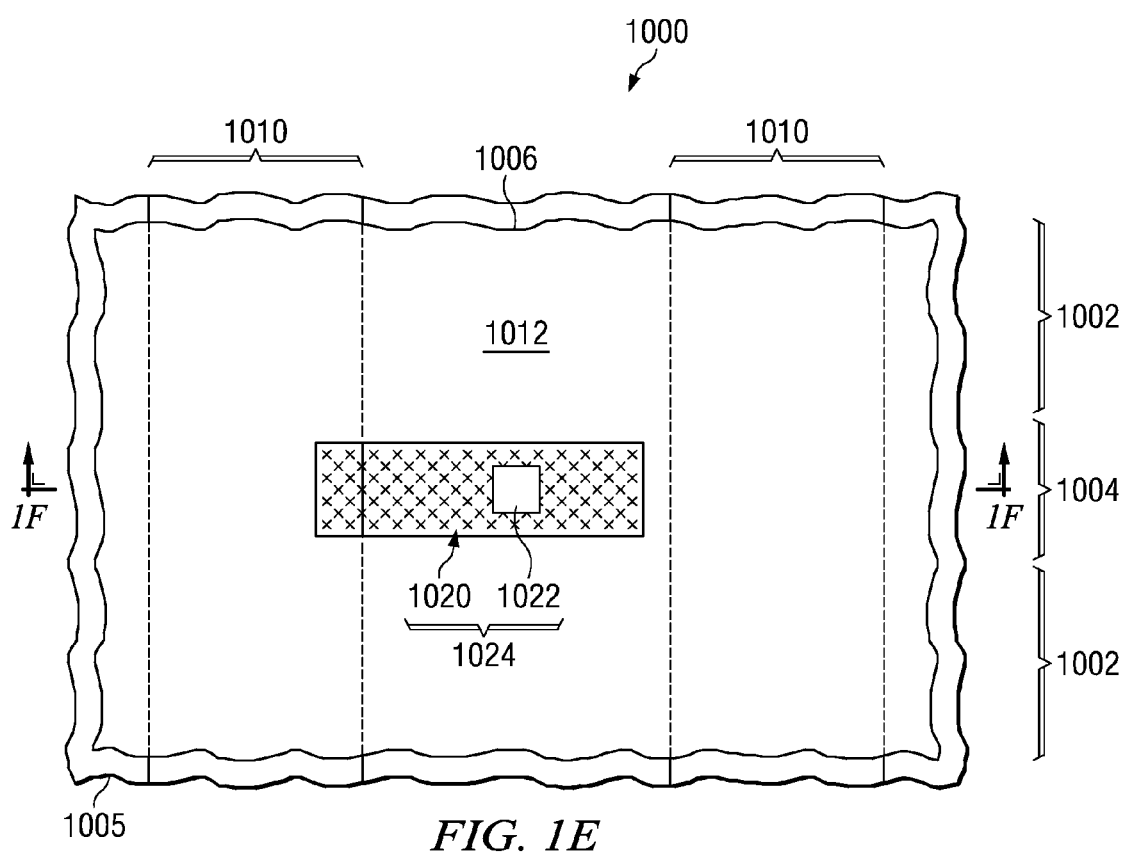

Referring to the top view of FIG. 1E, a substrate contact plug 1022 is formed over the top surface 1003 of the tap layer 1020 in the substrate tap active area 1008. A substrate contact structure 1024 is created by the combination of the substrate contact plug 1022 and the tap layer 1020.

Figure 1F:
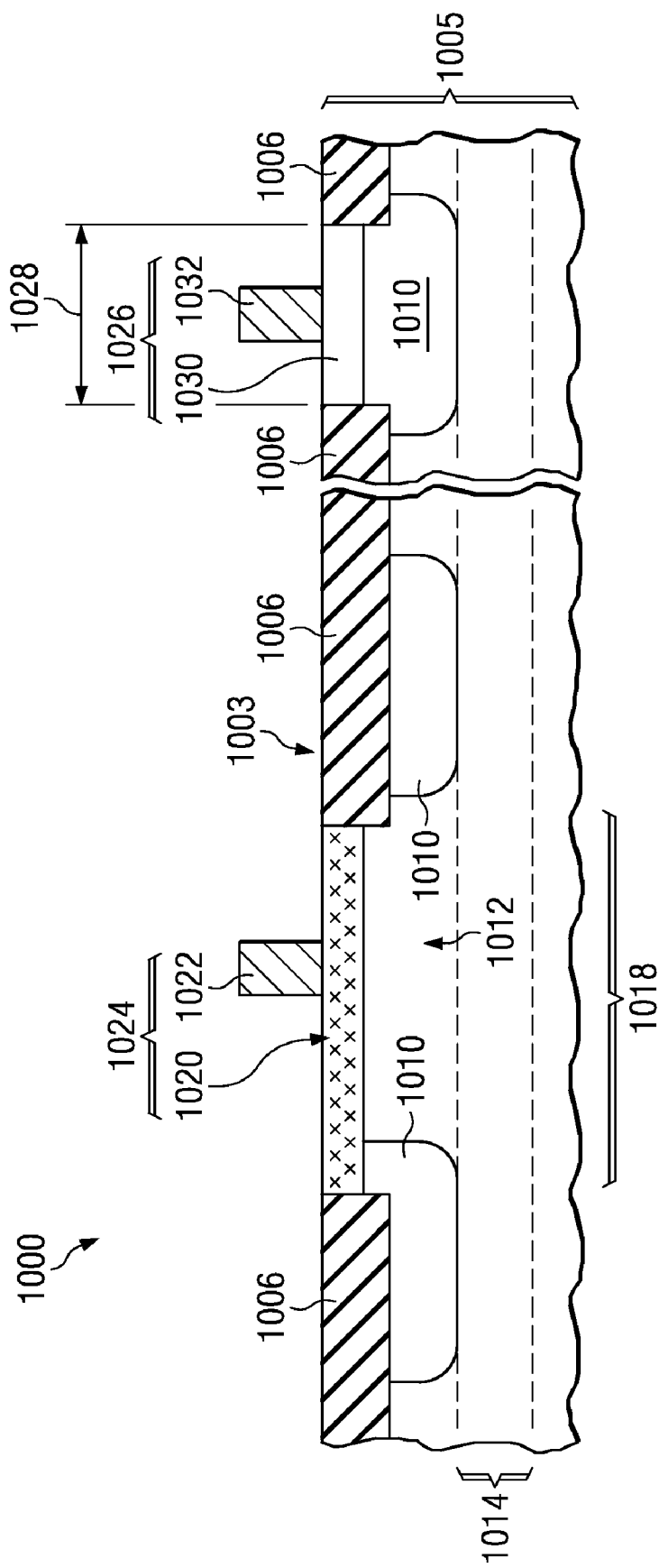

As shown in FIG. 1F (which is a cross section along the section line 1F-1F of FIG. 1E), the substrate contact plug 1022 is formed on a top surface of the tap layer 1020 so as to provide an electrical connection between the substrate contact plug 1022 and the second polarity well 1012. The top surface of the tap layer 1020 may also include a layer of metal silicide or other electrically conductive material.

The strap row 1004 containing the substrate contact structure 1024 may be narrower (e.g., less distance between SRAM cell rows 1002) than a strap row area containing a substrate contact structure that does not include a tap connecting region 1018 that connects regions of the source/drain/tap layer 1016 in adjacent wells. Forming a narrower strap row may provide a reduction of the total area occupied by the SRAM array within the integrated circuit 1000. It will be recognized that a strap row 1004 may contain more than one instance of the substrate contact structure 1024.

A first polarity well contact structure 1026 that makes electrical connection to an instance of the first polarity wells 1010 is also depicted in FIG. 1F. The first polarity well contact structure 1026 may include a first polarity tap layer 1030 in a first polarity well tap active area 1028 having the same conductivity type as the first polarity wells 1010. The first polarity well contact structure 1026 may also include a first polarity well contact plug 1032 on the top surface 1003 of the substrate 1005 over the first polarity tap layer 1030. Instances of the first polarity well contact structure 1026 may be disposed in the strap row 1004 along with instances of the well contact structure 1024.

Figure 2:
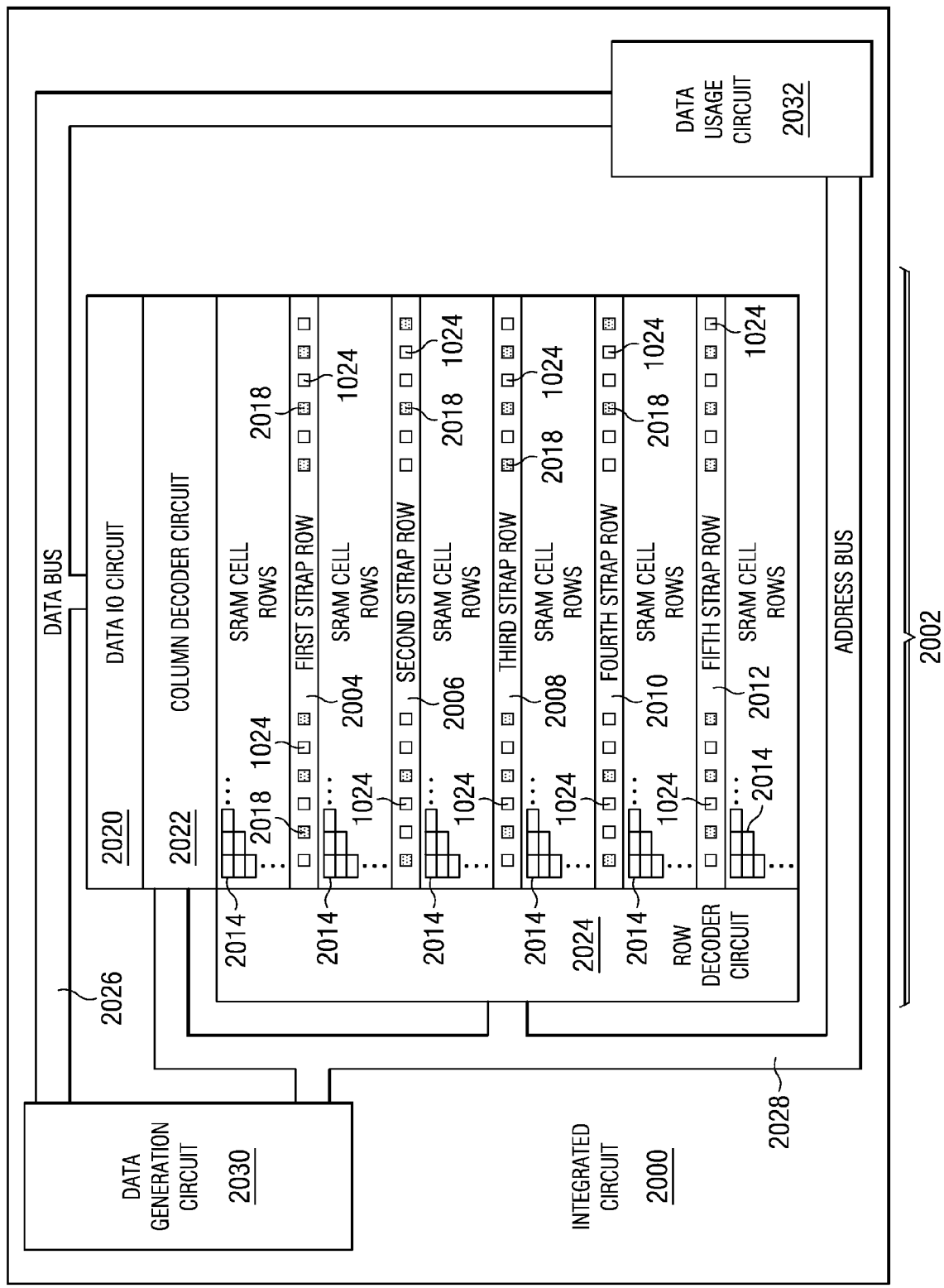
FIG. 2 is a top view of an integrated circuit containing an SRAM array that includes one or more strap rows.

FIG. 2 is a top view of an integrated circuit 2000 containing an SRAM array 2002 which includes one or more strap rows 2004, 2006, 2008, 2010, 2012. Rows of SRAM cells 2014 are formed between the strap rows 2004, 2006, 2008, 2010, 2012. In one version of the instant embodiment, one or more of the strap rows 2004, 2006, 2008, 2010, 2012 may have substantially identical configurations of the substrate contact structures 1024 described in reference to FIGS. 1A-1F (and depicted in FIG. 2 with boxes having no fill pattern) that provide electrical contacts to the second polarity wells 1002 of the integrated circuit 2000.

In another version, a first set of the strap rows (for example 2004, 2008 and 2012) may have a first configuration of substrate contact structures 1024, while a second set of the strap rows (for example 2006 and 2010) may have a second configuration of substrate contact structures 1024 (as depicted in FIG. 2). The strap rows 2004, 2006, 2008, 2010, 2012 will commonly include the first polarity well contact structures 1026 described in reference to FIG. 1F (and depicted in FIG. 2 with a dark fill) that provide electrical contact to the first polarity wells 1010 of the integrated circuit 2000.

A data input/output (IO) circuit 2020 is usually located adjacent to the rows of SRAM cells 2014. The data IO circuit 2020 writes data bits to and reads data bits from the SRAM cells 2014. A column decoder circuit 2022 is also usually located adjacent to the rows of SRAM cells 2014 and it controls entire columns of SRAM cells 2014. In addition, a row decoder circuit 2024 is usually located adjacent to the rows of SRAM cells 2014 and it controls entire rows of SRAM cells. The column decoder circuit 2022 and the row decoder circuit 2024 select the SRAM cells 2014 for read and write operations.

The integrated circuit 2000 further includes a data bus 2026 that interfaces to the data IO circuit 2020, possibly to a data generation circuit 2030, and also possibly to a data usage circuit 2032. The integrated circuit 2000 also includes an address bus 2028 that is connected to the row decoder circuit 2024 and the column decoder circuit 2022. In addition, the address bus 2028 may interface to the data generation circuit 2030 and to the data usage circuit 2032.

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit containing an SRAM array, comprising:
   a substrate of said integrated circuit;
   an SRAM cell row disposed in said SRAM array, said SRAM cell row containing a plurality of rows of SRAM cells;
   a strap row disposed in said SRAM array and located adjacent to said SRAM cell row;
   a layer of field oxide disposed at a top surface of said SRAM array;
   a first instance of a first polarity well of a first conductivity type disposed in said substrate, said first instance of said first polarity well extending through said SRAM cell row and said strap row;
   a second instance of said first polarity well of said first conductivity type disposed in said substrate, said second instance of said first polarity well extending through said SRAM cell row and said strap row;
   a second polarity well of a second conductivity type disposed in said substrate at a location between said first instance of said first polarity well and said second instance of said first polarity well, said second conductivity type being opposite from said first conductivity type;
   a substrate tap active area located in said strap row and disposed within an opening in said layer field oxide, said substrate tap active area also coupled to said second polarity well;
   a tap layer having said second conductivity type and disposed in said substrate tap active area, said tap layer partially overlapping said second polarity well so as to provide an electrical connection to said second polarity well; and
   a substrate contact plug located on a top surface of said tap layer, so that a combination of said tap layer and said substrate contact plug forms a substrate contact structure.

2. The integrated circuit of claim 1, in which said substrate tap active area includes a portion of at least one of said first instance of said first polarity well and said second instance of said first polarity well.

3. The integrated circuit of claim 1, in which said substrate tap active area includes a portion of said first instance of said first polarity well plus a portion of said second instance of said first polarity well.

4. The integrated circuit of claim 1, in which said substrate tap active area does not include a portion of said first instance of said first polarity well or said second instance of said first polarity well.

5. The integrated circuit of claim 1, in which said strap row includes a first polarity well contact structure that provides electrical contact to said first polarity well.

6. The integrated circuit of claim 1, in which:
   said first polarity well is n-type; and
   said second polarity well is p-type.

7. The integrated circuit of claim 1, said SRAM further including:
   a second SRAM cell row disposed in said SRAM array, said second SRAM cell row containing a plurality of rows of SRAM cells, such that a second instance of said second polarity well extends through said second SRAM cell row;
   a second strap row disposed in said SRAM array and located adjacent to said second SRAM cell row, such that said second instance of said second polarity well extends through said second strap row; and
   a second instance of said substrate contact structure disposed in said second strap row.

8. The integrated circuit of claim 7, in which:
   said first strap row has a first configuration of said substrate contact structure; and
   said second strap row has said first configuration of said substrate contact structure.

9. The integrated circuit of claim 7, in which:
   said first strap row has a first configuration of said substrate contact structure; and
   said second strap row has a second configuration of said substrate contact structure.

10. The integrated circuit of claim 1, further including:
    a data input/output circuit coupled to said SRAM cell row;
    a data bus coupled to said data input/output circuit; and
    a data generation circuit coupled to said data input/output circuit.

11. The integrated circuit of claim 1, further including:
    a data input/output circuit coupled to said SRAM cell row;
    a data bus coupled to said data input/output circuit; and
    a data usage circuit coupled to said data input/output circuit.

* * * * *